METHOD OF CONNECTING A TERMINAL TO A PRINTED CIRCUIT PANEL

Filed Aug. 3, 1966

INVENTOR
NICHOLAS L. WOLF
BY
Williamson, Palmatier & Bains
ATTORNEYS

United States Patent Office 3,445,929

Patented May 27, 1969

3,445,929

METHOD OF CONNECTING A TERMINAL TO A PRINTED CIRCUIT PANEL

Nicholas L. Wolf, 353 5th St. S., Sauk Rapids, Minn. 56379

Filed Aug. 3, 1966, Ser. No. 570,007
Int. Cl. B41m 3/08; H05k 3/20
U.S. Cl. 29—625 2 Claims This invention relates to terminal or pin connectors for use with printed circuit panels for detachable connection with components such as lead wires, vacuum tubes, transistor pins and the like, and more particularly to pin-receiving connectors which may be made on minute scale, which are readily applicable to desired points on the printed circuit panel and which enable mechanical and detachable connection as well as efficient electrical connection to be made between pins and terminals for interconnecting leads on both sides of the panel with the desired components, and particularly without requiring any soldering operation during or after such connection.

Printed circuit panels are generally employed in small, compact units wherein space is at a premium, and in units designed for long maintenance-free service.

At this time, printed circuits on a panel are connected to outside pins and leads in a variety of ways. In most instances embedded metal inserts having eyelet portions are embedded in the panels and soldering is required on one or the other surfaces of the panel to make and assure electrical connection, and in many instances, mechanical connection which will not release under conditions of shock and vibration. In some instances, outside leads are connected to the eyelet as by soldering, and in some instances, by nuts or screws. The employment of nuts or screws, or special lead or pin endings is generally unsatisfactory from the standpoint of time, materials and space. The above enumerated methods are quite apt to develop faulty and unreliable electrical connections under conditions of vibration. Soldering often produces deleterious effects of heat on the plastic or ceramic panels in use.

It is an object of my invention to eliminate the disadvantages enumerated above and providing tubular connector elements which may be manufactured commercially at very litle expense and on minute scale, and which provide positive and permanent connections between outside pins or leads and a printed circuit with provision for detachment when necessary, and which connectors may be rapidly and easily installed by unskilled personnel.

My novel construction takes the form of a specially shaped, hollow rivet with reinforced, upper projection enabling the connector to be securely attached and electrically connected by pressure and attachment with points passing through one or two plated conductors of the circuit on opposite sides thereof. From the components, even on the smallest scale of our connector elements, pins or the like make wiping pressure contacts with the tubular portions of the rivets, assuring excellent electrical connection between the pins, the frictional tubular connection portions and the metal plating conductors at one or the other, or both sides of the circuit panel.

Another object is the provision of a printed circuit, terminal connector adapted for use with any wire size or printed circuit panel thickness, and which may be commercially manufactured at low cost.

A still further object is the provision of a connector of the class described which will enable rapid and reliable connections of outside leads to printed circuits to be made by unskilled personnel in a minimum of space.

Another object of the invention is the provision of a connector which will entirely eliminate the use of solder for connecting outside pins or leads to printed circuits.

These and other objects and advantages of my invention will more fully appear from the following description made in connection with the accompanying drawings, wherein like character references refer to the same or similar parts throughout the several views, and in which:

FIG. 1 is a plan view on an enlarged scale, of a fragment of a printed circuit panel showing three of my novel connectors in use and receiving three terminal pins of an electrical component such as a transistor, the circular dotted lines indicating the periphery of the component mounted on the lower side of the panel, and the straight dotted lines indicating a printed conductor plating on the opposite side of the panel;

Figure 6:
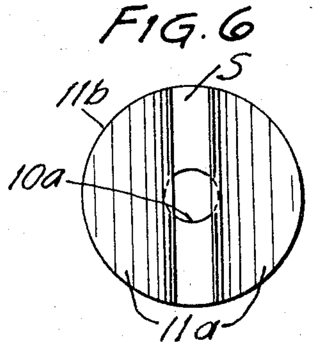
Figure 2:
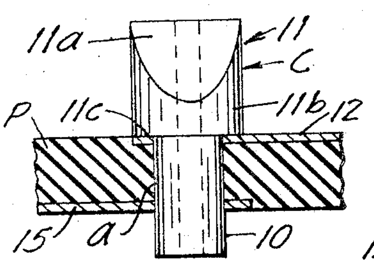
FIG. 2 is a fragmentary vertical cross section on a greatly enlarged scale, showing a side elevation of an embodiment of my connector mounted in a pin aperture of the circuit panel prior to swedging and flaring of the connector in rivet fashion.
Figure 3:
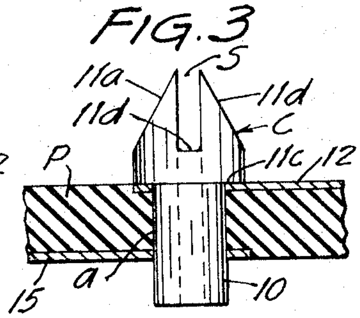
FIG. 3 shows a similar view of the same connector rotated 90 degrees from its position in FIG. 2.
Figure 5:
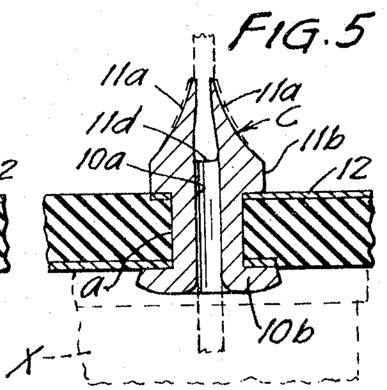
Figure 7:
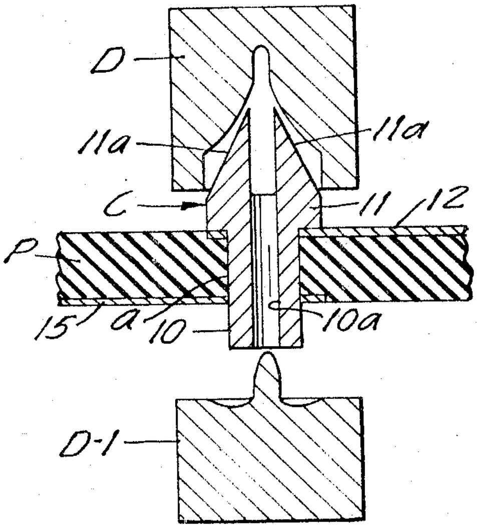
Figure 8:
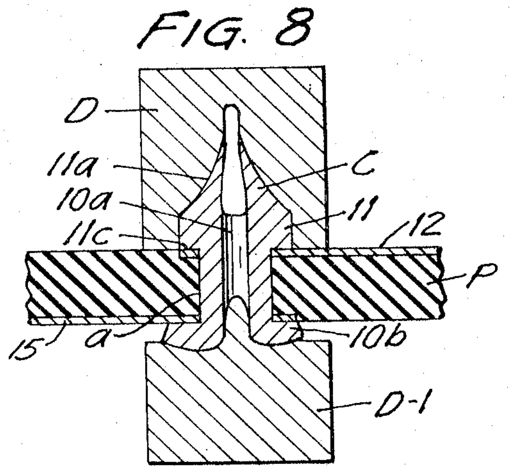
Figure 9:
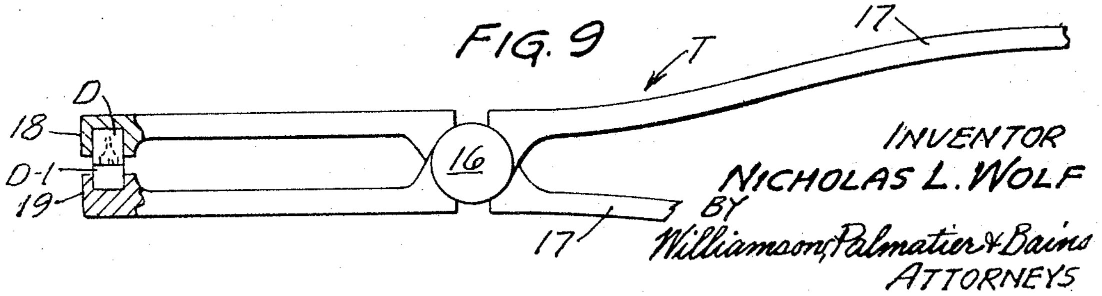

FIG. 5 is a cross section on the same enlarged scale as FIGS. 2 and 3 showing in full lines, my connector riveted and clamped in a circular pin hole of the circuit panel, and showing in dotted lines, below the panel, a portion of the external shape of an electrical component such as a transistor, and further showing in dotted lines above the panel, the extremity of one transistor pin and the slightly spread position of the connector head with the pin frictionally gripped therein;

FIG. 6 is a top plan view on a greatly enlarged scale, of my connector head as it is constituted after attachment to a circuit panel and prior to insertion and reception of the terminal pin or the like;

FIG. 7 is a fragmentary vertical section on the same scale as FIGS. 2, 3 and 5, showing an embodiment of my invention disposed in a predetermined pin aperture of a circuit panel before riveting thereto, and diagrammatically a pair of riveting and swedging dies positioned for operation upon the connector;

FIG. 8 shows a similar section with the connector element flared at its lower end to tightly, with the assistance of the enlarged head, clamp against two conductive platings on opposite sides of the panel, and showing the inwardly swedged position of the upper slotted frictional connection portion of the connector; and FIG. 9 is a side elevation with terminal portions broken away and shown in section, illustrating a suitable type of plier tool manually performing the riveting and swedging operations essential to rivet my connector to a panel and at the same time, swedge the friction jaws inwardly from their original positions after manufacture.

My electrical connectors are constructed preferably integrally from metals and metal alloys having high electroconductivity; having requisite malleability or ductility; and having a fair amount of resiliency. Metals and alloys which are highly suitable for the construction of my conductors include copper, copper alloys, beryllium-copper, silver and silver alloys, and even some of the aluminum alloys which possess resiliency. The preferred embodiment of my connector illustrated in the drawings, indicated as an entirety by the letter C, has a tubular body 10 of greater length than the thickness of the dielectric panel upon which it is to be mounted, and which has an external diameter very closely fitting the predetermined circular pin apertures which extend through the metal platings and also the dielectric panel at predetermined desired locations. In certain printed circuitry, the pin apertures may require slight enlargement over those usually used, but with my structure, the external diameter of the tubular body 10 may be less than .05 inch and the internal diameter may be made less than .016 inch.

Integrally formed with the tubular body, I provide an enlarged head 11 which preferably but not necessarily has two sharply sloping or beveled converging sides 11*a* merging into a lower cylindrical portion 11*b*. The cylindrical portion 11*b* defines an overhanging, substantially horizontal annular flange 11*c* for seating against and electrically connecting with a plating 12 at the top of a circuit panel. The annular flanged surface may, if desired, be slightly roughened, although such is not required to obtain excellent electrical connection.

My novel electrical connector, in FIGS. 2, 3, 4 and 7 is shown in shape and form as it is constituted after completion of manufacture. It is diametrically slotted from its upper extremity or apex to the line 11*d*, where communication with the cylindrical passage 10*a* of the body is made. The rectangular slot, designated as S in the manufacture of the connector, is throughout its length of uniform width and that width is the same as the diameter of the cylindrical passage 10*a*.

The manufacture of the connector product heretofore described, is simple and economical. Connectors may be die cast or with expensive high pressure dies, may be formed from original thicker tube stock. The ductility of the metal lends itself to the necessary draw action. My connectors may be produced at exceedingly low cost in high capacity operations and of course it is contemplated that the connectors will vary somewhat in size for the particular circuit panels intended. They may be made in very diminutive size for the more compact, very small printed circuit panels.

FIGS. 7 and 8 illustrate diagrammatically the manner of attachment, the riveting or spreading of the lower end of body 10, and the swedging of the jaws formed in the uppermost portion of the head 11. The connector C is thrust through the appropriate pin aperture in the dielectric circuit panel P with the overhanging annular flange in abutment with the top conductive plating 12, and with the lower end of the tubular body 10 extending for some distance below the bottom surface of the panel P.

Figure 4:
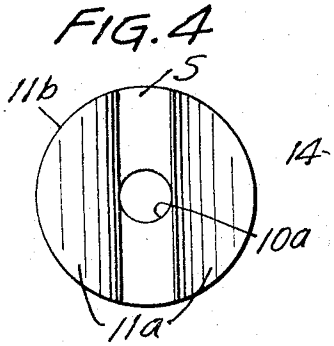
FIG. 4 is a greatly enlarged top plan view of my connector detached.
Figure 1:
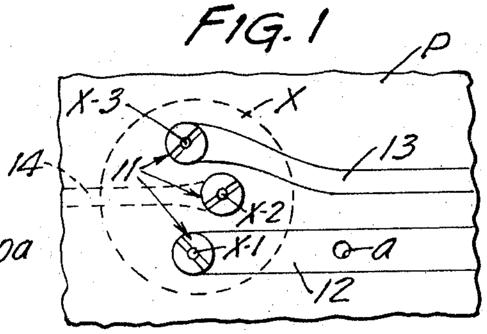

In FIGS. 7 and 8 it will be noted that the lower end of the tubular body 10 passed through an aperture in a lower conductive plating 15, not shown in FIG. 1.

Opposed upper and lower die members D and D–1 respectively, constructed in shape and form as shown in FIGS. 7 and 8, are then employed with suitable apparatus to axially align the dies and force the same towards each other. In the cooperating movement of the dies with adequate power applied, the lower die will flare out the lower end of body 10 riveting the same to the underside of panel P and against any conductive plating through which the body 10 passes, forming an annular flange 10*b* as shown in FIGS. 8 and 5. It will be noted that the reformed rivet portion 10*b* of the body is flared outwardly and upturned to a slight extent where it will slightly compress against and electrically connect with any plating at the lower side of the panel by which the body 10 is surrounded.

Simultaneously with the riveting of the lower extremity of body 10, the upper die member D swedges the two jaws formed in the head 11 by the slot S, slightly together from the shape shown in FIGS. 3 and 7, to the precise shape and form shown in full lines in FIGS. 5 and 8. In FIG. 5 the downwardly diverging, straight dotted lines indicate the original configuration of the outward, sharply declined faces 11*a* of the jaws, as well as the approximate position when the terminal (dotted lines) is thrust upwardly with force through the body and jaws.

The riveting and clamping action with the upturn is such as to very efficiently draw the flange 11*c* of the head tightly against the portion of the plating 12 through which the body 10 is passed.

It will of course be understood that while diagrammatically there is shown only one set of cooperating die members D and D—1, in commercial application of the process described herein and the use of my connectors, apparatus will be set up for high speed operation of two platen or other frame members, the upper of which will carry corresponding die members D positioned precisely for engagement with the upper ends of the respective connectors which are to be utilized in a predetermined circuitry while a lower platen will carry all of the die members D—1 for cooperation with the series of upper die members D for all connectors to be applied to the circuitry. Thus, by mechanical power the two platens or frame members, each carrying a multiplicity of the respective die elements will be forced together and all of the connectors employed will be simultaneously riveted, clamped and the heads swedged in the manner previously described.

FIG. 1 illustrates a fragment of a printed circuit panel and is a top plan view showing the panel equipped with two conductive platings 12 and 13 on the upper surface and with a third plating 14 on the underside of the panel. Three connectors are employed, each having its tubular body extending through a pin aperture of the panel and through an aperture in one of the respective conductive platings 12, 13 and 14. The configuration of an electrical component such as a transistor X is shown in dotted lines in FIG. 1 and the three terminal pins thereof X—1, X—2 and X—3 extend through the tubular bodiees 10 of the respective connector elements and through the jaws formed by slot S in the head 11 of the respective connectors. Forcing of the pins upwardly in physical connection with the connectors causes friction with the slightly deformed inner sides of the jaws formed by slot S, spreading the jaws resiliently outwardly but producing in said physical connection, a sliding frictional contact with the resultant detachable retention of the pins.

Such sliding or wiping frictional contact between the terminal pin and the opposed sides of the resilient jaws of the head 11, causes excellent electrical connection to be made between the terminal and my connector element C, the jaws being constantly urged into contact with the pin through the inherent resiliency thereof.

In fact, physical or supporting connection is so well made that lighter electrical components such as resistors and small vacuum tubes will be physically supported and held against displacement through vibration and jarring from below the panel. Of course, if heavier components are to be supported from the panel rather than on top thereof, the protruding terminals of the pins or other leads, may be bent across the top apex of the connector element, for more positive physical support.

From the foregoing, it will be seen that without the use of solder at any point between the head and overhanging annular flange 11*c*, and conductor platings on the top of the panel, and also electrical connection between the out-turned rivet portions 10*b* of my connector and any conductive platings at the bottom of the panel, excellent electrical connection is made between all the desirable parts.

In FIG. 9, I disclose a simple, pliers-like tool T which will enable a person to manually, quite accurately and quickly attach a connector to the panel through a desired circular aperture therein. Tool T has a pair of handles 17 intermediately pivoted on pivot 16 and as shown in the broken-away portions, carries opposing sockets 18 and 19 for frictionally retaining the circular die elements D and D—1. The use of this tool will be readily apparent from the previous description and the illustration in FIG. 9.

Referring again to the friction jaws formed in the enlarged head 11 of my connector by the provision of the dividing slot S, it is important that the thickness of the two jaws decrease or taper from their interconnection with the base or cylindrical portion **11*b***, outwardly of the head to the outer extremities thereof (apex of the connector head). While sharply beveled exterior sides, as shown in the form illustrated are adequate, it will of course be understood that various equivalent forms such as a head of truncated conical form could be utilized to the same advantages and within the scope of the invention.

It is also essential that the tapering of the thicknesses of the jaws, and specifically with reference to the external surfaces **11*a*** thereof, be symmetrical to cause centering of the head for swedge action as illustrated in FIGS. 7 and 8 with forming dies D. This tapering furthermore, gives greater flexibility to the jaws when the terminal pin of a component is received.

While the opposing longitudinal jaw surfaces may be as shown constructed in planar fashion in the preformed connector before swedging, it will also be understood that the slot S may be formed in the head to produce longitudinal concave gripping surfaces in the jaws.

The actual upward slight converging of the friction gripping surface of the jaws will vary depending upon the resiliency and flexibility of the particular metal or alloy from which the connector is formed but approximates a range where the converging friction surfaces jointly define an angular relation of between 6° and 13°. In this connection it will be apparent that because of the symmetrical tapering of external surfaces of the jaws, the swedging action which takes place simultaneously with the riveting action, with the same size connector may be varied, using different dies for the swedging action.

Referring to FIGS. 7 and 8, if the swedging dies D had internal surfaces converging at a greater common angle than that shown in the drawings, the two opposing jaws of the connector head would be drawn closer together.

The use of two or more sets of swedging dies would also enable the connector, when attached in the last steps of my method or process, to fit frictionally and effectively from the standpoint of electrical connection terminal pins or the like varying considerably in diameter.

From the foregoing description it will be seen that I have provided not only a novel terminal connector for the uses set forth, but that I have disclosed a new and efficient method or process of making, preforming and attaching terminal connectors to circuit panels and the like which are provided with predetermined pin apertures therein. This method or process begins with the preforming or manufacture and shaping of a tubular body having an external diameter approximately that of the apertures, and constructing this body from an integral quantity of metal having high electro-conductivity, inherent resiliency and fair ductility. The method of preforming further requires that the body has an enlarged head formed at its underside as a flange for electrical connection with the metal surrounding a pin aperture in the panel. It further requires that the body proper has an outer end which will project beyond the panel. The preforming or manufacture requires slotting by some means, of the enlarged head diametrically to form parallel, substantially planar gripping jaws, and preferably, the forming of the exterior surfaces of said jaws so that these exterior surfaces converge symmetrically to give increasing flexibility to the jaws as they approach their extremities.

The foregoing steps all relate to the making and preforming of the connectors in state to be used before the affixation thereof to the panel. My method and process includes the attachment steps for positioning the body in a predetermined terminal aperture and thereafter, simultaneously applying force in opposite directions axially of the body to both the head and the outer end of the body to cause said outer end to be riveted against one surface of the panel while simultaneously causing the jaws of the head to be swedged together slightly at the outer end of this head to thereby deform said gripping surfaces from a parallel relationship to an outwardly converging relationship for frictional connection with a terminal pin.

It will of course be understood that various changes may be made in the form, arrangement and details of the parts without departing from my mechanical device invention, and that likewise sequence of steps in the preforming and manufacturing operations of the process may be changed or varied, all within the scope of my method claims.

What is claimed is:

1. The method of ataching and reforming a terminal connector to a printed circuit panel having a predetermined circular pin aperture therein which consists in:

utilizing a terminal connector of a construction having a tubular body made integrally from a metal having high electro-conductivity, inherent resiliency and fair ductility, and provided with an outer reduced end of cylindrical shape and external diameter to closely fit said circular pin aperture, said body having an enlarged head having an under flange of annular shape for electrical connection against metal surrounding said pin aperture, said head being slotted diametrically to form opposed, parallel gripping jaws, and said body being further dimensioned in length to cause its outer end to project beyond said panel when inserted in said aperture;

positioning said body in said pin aperture and thereafter simultaneously applying force in opposite directions axially of said body to said head and to said outer end of said body, causing said outer end to be flared and riveted against one surface of said panel while simultaneously deforming opposed portions of said jaws inwardly by said force to thereby provide opposed, inwardly extending surfaces on said gripping jaws adapted to frictionally engage a terminal pin therebetween.

2. The method as set forth in claim 1 including all of the recitations thereof and steps recited, further characterized by:

in said application of force in opposite directions axially of said body simultaneously deforming said opposed portions by swaging said jaws of said head together slightly at the outer end of said head, thereby deforming said gripping jaws from their original parallel relationship to an outwardly converging relationship for frictional connection with a terminal pin.

References Cited

UNITED STATES PATENTS

| | | | |
|---|---|---|---|
| 1,449,727 | 3/1923 | Bowman. | |
| 2,992,403 | 7/1961 | Hawk | 339—17 XR |
| 3,292,138 | 12/1966 | Jones et al. | 339—220 |

DARRELL L. CLAY, *Primary Examiner.*

U.S. Cl. X.R.

85—37, 77; 174—68.5; 339—17, 220